(12) United States Patent
Mallinson

(10) Patent No.: US 6,954,165 B2
(45) Date of Patent: Oct. 11, 2005

(54) VOLTAGE SEGMENTED DIGITAL TO ANALOG CONVERTER

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 10/810,310

(22) Filed: Mar. 26, 2004

(65) Prior Publication Data

US 2004/0212526 A1 Oct. 28, 2004

Related U.S. Application Data

(60) Provisional application No. 60/458,907, filed on Mar. 28, 2003.

(51) Int. Cl.[7] .............................. H03M 1/66; H03M 1/78
(52) U.S. Cl. ........................ 341/144; 341/154; 341/156
(58) Field of Search ................................ 341/144, 154, 341/159, 145

(56) References Cited

U.S. PATENT DOCUMENTS

| | | | | |
|---|---|---|---|---|
| 5,111,205 A | * | 5/1992 | Morlon ........................ 341/156 |
| 5,495,245 A | * | 2/1996 | Ashe ........................... 341/145 |
| 5,619,203 A | * | 4/1997 | Gross et al. ................. 341/144 |
| 5,703,588 A | * | 12/1997 | Rivoir et al. ............... 341/159 |
| 5,731,775 A | * | 3/1998 | Gross et al. ................. 341/155 |
| 6,225,929 B1 | * | 5/2001 | Beck ........................... 341/144 |
| 6,424,283 B2 | * | 7/2002 | Bugeja et al. .............. 341/145 |
| 6,433,717 B1 | * | 8/2002 | Leung ......................... 341/144 |
| 6,486,818 B1 | * | 11/2002 | Nicholson et al. .......... 341/154 |
| 6,525,573 B1 | * | 2/2003 | Guerrero Mercado ....... 327/72 |
| 6,617,989 B2 | * | 9/2003 | Deak .......................... 341/144 |

* cited by examiner

Primary Examiner—Jean Bruner Jeanglaude
(74) Attorney, Agent, or Firm—Stevens Law Group, P.C.

(57) ABSTRACT

An improved segmented digital to analog converter is provided, configured with a novel method of compensating current flow in secondary or successive segmented elements. In operation, dual current devices initially load, then subsequently unload a cascade of resistor networks connected to the secondary or successive voltage segmenting elements, preventing the perturbation of precise operation of the primary or preceding elements. In contrast to conventional approaches, the improved converter obviates the need for a buffer or amplifier to isolate the secondary and successive voltage segmenting elements from the primary or preceding elements. In further contrast to conventional devices, a second and third successive voltage segmenting elements, where a third segmented series of resistors has a third set of resistors connected end to end from along which an output can be generated at any point between the resistors, wherein the third segmented series of resistors further includes one current source connected at one end of the third series of resistors, and a second current source connected at another end of the third series of resistors.

11 Claims, 2 Drawing Sheets

VOLTAGE SEGMENTED DIGITAL TO ANALOG CONVERTER

RELATED APPLICATIONS

This application claims the benefit of U.S. Provisional Application Ser. No. 60/458,907, filed on Mar. 28, 2003.

BACKGROUND

The invention relates generally to digital to analog converters (DACs) and, more particularly, relates to an improved voltage segmented DAC that requires no buffer.

Digital converters (DACs) are well known in the art, and are configured to convert a digital signal to a voltage, or an analog signal. In high speed or high resolution applications, conventional DACs suffer from their complexity bulkiness as a result of a large number of components, and often lack linearity.

Voltage segmented DACs are a conventional approach to this problem, and are configured with multiple stage resistor strings. In one example, a segmented DAC is configured in two stages with separate resistor strings that resolve two sets of digital bits, higher order and lower order bits. It has been observed, however, that the application of secondary or successive voltage segmenting elements has perturbed the precise operation of the primary or preceding elements. This configuration and other similar conventional approaches require a buffer or amplifier to isolate the secondary and successive voltage segmenting elements from the primary or preceding elements. Buffers and amplifiers add a large number of components to a circuit, and affect the speed and accuracy of operation of the circuit.

Therefore, there exists a need for an accurate DAC, but that does not require a buffer. As will be seen, the invention provides such a DAC in an elegant configuration.

BRIEF DESCRIPTION OF THE DRAWINGS

The invention is illustrated by way of example and not limitation in the figures of the accompanying drawings. The same numbers are used throughout the figures to reference like components and/or features.

DETAILED DESCRIPTION

Figure 1:
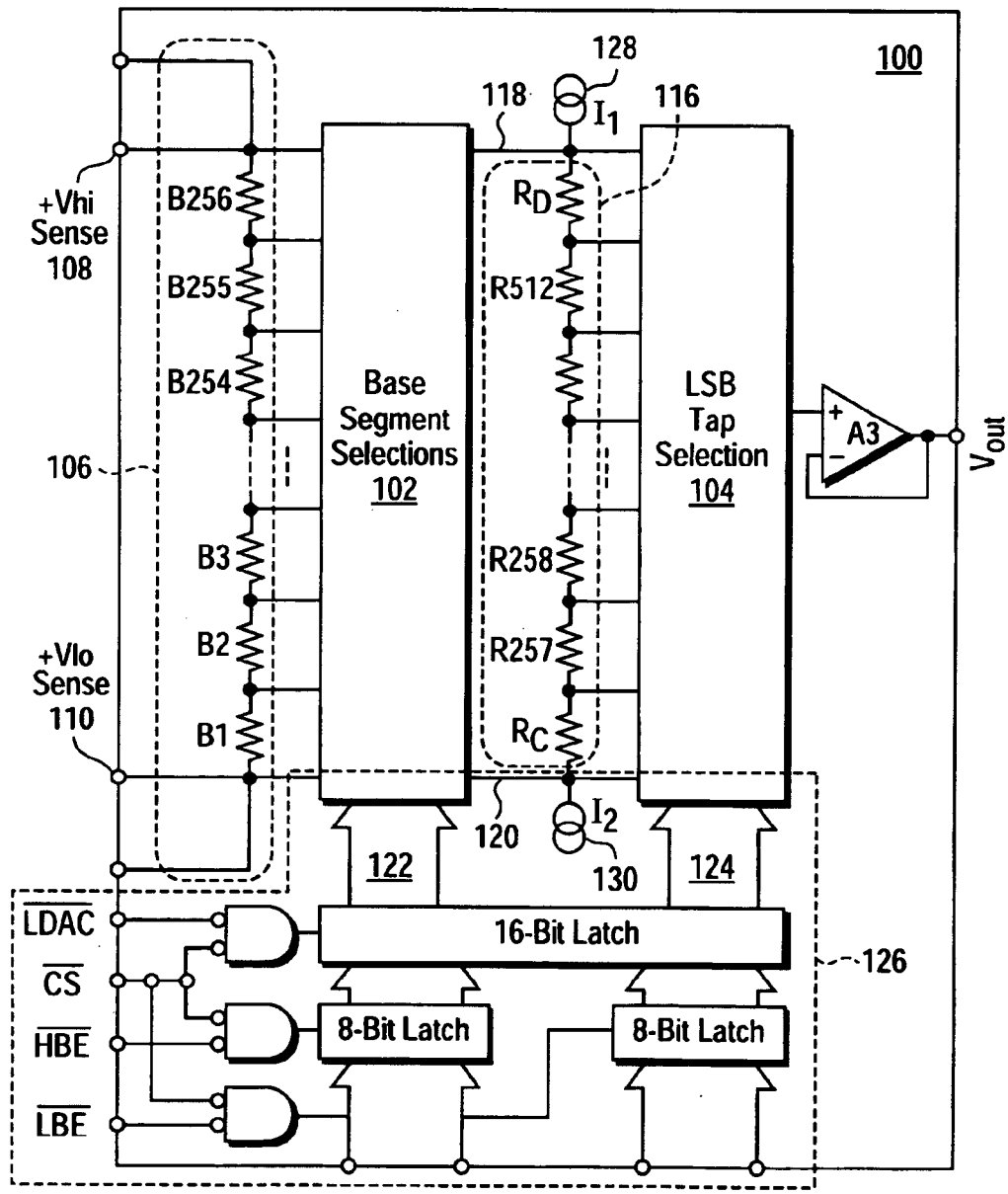
FIG. 1 is a schematic diagram of an improved segmented DAC according to the invention.

An improved segmented digital to analog converter is provided having a first segment with a series of resistors and configured to receive and convert one set of digital bits of the input signal to an analog signal. The converter further has a second segment configured to receive and convert a second set of digital bits from the input signal to an analog signal. The second segment has a second series of resistors configured to receive the second set of digital bits of the input signal. The second segment has a first current source connected at one end of the second series of resistors, and a second current source connected at another end of the series of resistors. In operation, a current is transmitted between the two current sources to substantially remove error from the digital bits received in the form of a digital signal received at the second segment.

The invention is directed to an improved segmented digital to analog converter configured with a novel method of compensating current flow in secondary or successive segmented elements. In operation, dual current devices initially load, then subsequently unload a cascade of resistor networks connected to the secondary or successive voltage segmenting elements, preventing the perturbation of precise operation of the primary or preceding elements. The improved converter removes substantially all errors from the secondary or successive cascade of connected resistor networks, and does not substantially disturb the circuit as a whole. In contrast to conventional approaches, the improved converter obviates the need for a buffer or amplifier to isolate the secondary and successive voltage segmenting elements from the primary or preceding elements. Clearing out errors existing in the secondary or successive elements serves to prevent errors that would previously cause errors in the primary or preceding elements, obviating the need for isolation of the secondary or successive elements.

In one embodiment, a segmented digital to analog converter is provided having an input for receiving an input signal and an output for outputting an analog output signal. A first segment is configured to receive and convert one set of digital bits of the input signal to an analog signal. A second segment is configured to receive and convert a second set of digital bits of the input signal to an analog signal, where the second segment has a series of resistors configured to receive the second set of digital bits, a first current source connected at one end of the series of resistors, and a second current source connected at another end of the series of resistors. In operation, current is transmitted between the first and second current source in a manner that substantially removes error in the transmission of the second set of digital bits. The current transmitted between the first and second current source is performed in a manner that substantially removes error in the transmission of the second set of digital bits without creating a disturbance in the circuit as a whole.

Referring to FIG. 1, a novel segmented DAC 100 configured according to the invention is illustrated. The elements 126 of FIG. 1 are one means by which a digital signal may be accepted into the DAC—elements within 126 are not the subject of this disclosure and are included only to illustrate one example of a digital connection scheme. One conventional digital connection scheme is used on the Analog Devices AD569: a voltage segmented DAC. The DAC is configured as a 16 bit DAC, and the processing is separated into the eight most significant bits, and the eight least significant bits. The invention is not limited by the number of bits the DAC is configured to process, but extends to any size DAC.

The DAC includes a most significant bit (MSB) segment selector 102 configured to process the eight most significant bits of a sixteen bit input, and further includes a least significant bit (LSB) segment tap selector 104 configured to process the eight least significant bits of the sixteen bit input. Preceding selector 102 is a cascading bank of resistors 106. This bank of resistors is configured to receive a positive voltage Vhi 108 and a negative voltage Vlo 110 thereby defining the range of the DAC to voltages between Vlo and Vhi. Selector 104 is connected to a cascaded resistor bank 116. The upper and lower voltages of this cascade of resistors 116 are set by nodes 118 and 120 respectively.

As the 8 bit number 122 is changed the nodes 118 and 120 are connected to successive taps on the primary resistor chain 106. The voltages on nodes 118 and 120 represent the first 8 bit subdivision of the DAC range defined by the voltages on nodes 108 and 110. The design intention is that the second resistor cascade 116 will further subdivide the voltage between 118 and 120. Within the base segment selector 102, it may be desirable to use FET switches, or FET devices configured to operate as simple switches. By this means, the node 118 is connected to a node emerging from 106 and 120 is connected to a node typically one tap below that node where 118 is connected.

It will be obvious to those skilled in the art that such a connection would cause a current to flow out of node 118 and into node 120, that current being the current flowing in the secondary resistor chain 116. Thus, without benefit of the invention, an error voltage is present in the first resistor chain 106. It is known in the art that a buffer or amplifier taking essentially zero input current may be interposed between nodes 118, 120 and the secondary chain 116 to obviate this problem. However it is also well known that such a buffer amplifier has its own problems, where the offset voltage contributes an error and the finite bandwidth increases settling time. A circuit configured according to the invention removes the loading error without use of a buffer amplifier.

Figure 2:
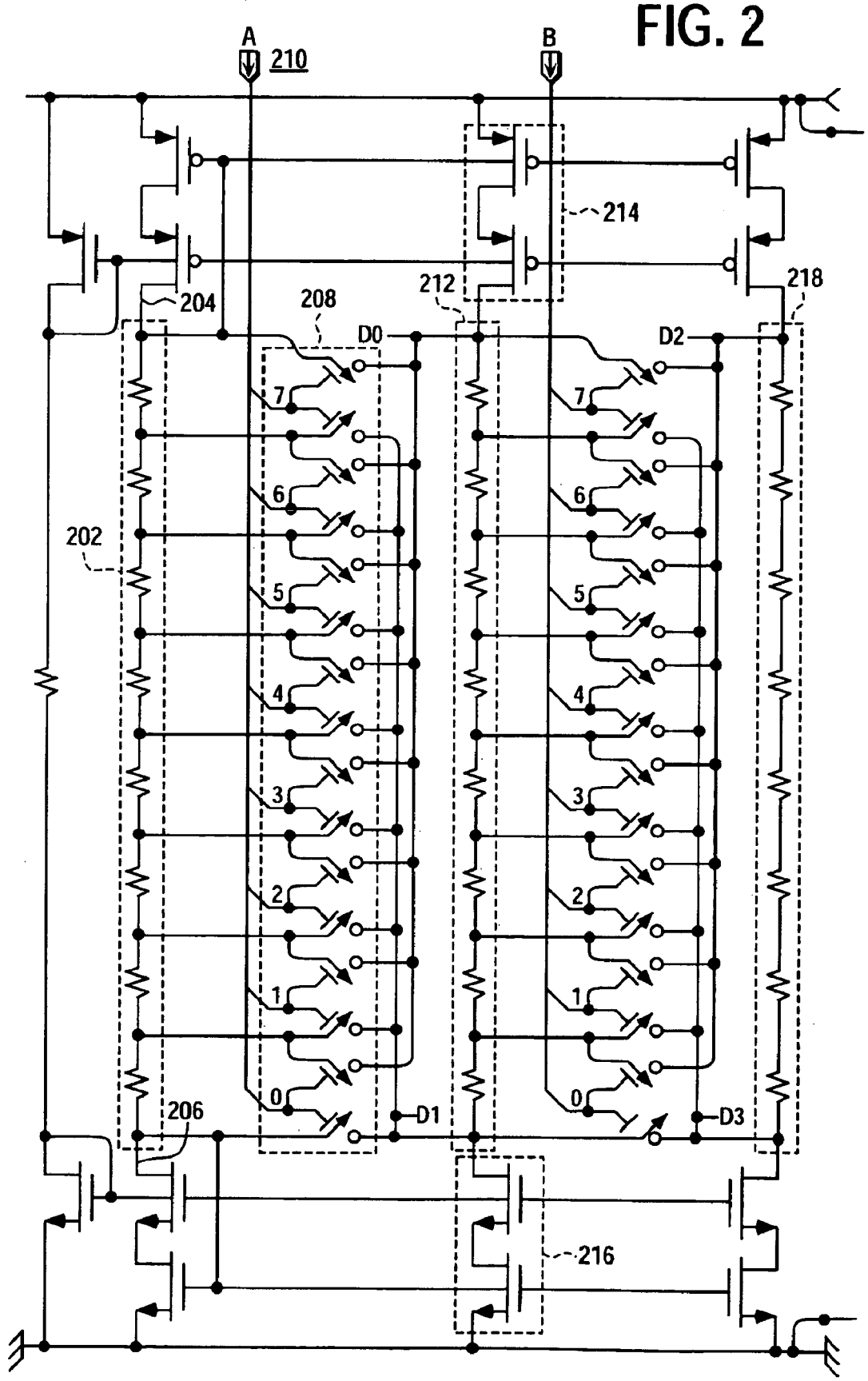
FIG. 2 is a more detailed schematic diagram of an improved segmented DAC according to the invention.

The innovation lies in the use of a current that is pushed into and then taken out of the subsidiary resistor strings using the current devices 128, 130. This operation is performed in such a manner that the voltage across the subsidiary string of resistors is already substantially equal to the voltage across the segments where it will be connected by the action of the switches. Referring to FIG. 2, one means is illustrated by which that current may be made, namely by biasing the first resistor network between low impedance points of a current source and deriving a scaled version of that current from a parallel connection of PMOS and NMOS devices. It will be evident to those skilled in the art that other means to create this current are possible without departing from the spirit and scope of the invention.

Referring to FIG. 2, an improved segmented DAC 200 is illustrated in accordance with the invention. The first set of eight resistors 202 is connected between low impedance nodes 204, 206 as shown. In operation, this creates a voltage from end to end on the bank of resistors 202 that is divided into eight equal voltages. The voltage is made available via the set of switches 208, shown here as 8 switches numbered 0–7, controlled by the bus "A" 210 to the second set of resistors 212.

In conventional systems, this second set of resistors 212 would, if connected by the switches 208, be expected to cause an error. That error would be that the resistors 212 would in effect lower the incremental resistance of the resistor, for each corresponding resistor of resistor bank 202 to which the second bank is connected, across which they connected, thus disturbing the voltage across it. However, according to the invention, the expedient of providing a current from device 214 into the top and removing the same current from the bottom of this second set of resistors with current device 216 is sufficient to substantially remove this error. This result may be seen and better understood by consideration of the superposition of currents. The ideal current that the second set of eight resistors must take in order to have the ideal voltage across them is simply one eighth of the current flowing in the first resistor chain. There are eight secondary resistors of the same value as the first eight resistors. They have only $1/8^{th}$ of the voltage across them, hence $1/8^{th}$ of the current through them. In conventional circuits, this current would have to flow out of the first resistor chain, thus disturbing it. However, in the improved circuit illustrated in FIG. 2, and according to the invention, the devices 214 and 216 each form part of a cascoded current source providing this current. Hence no current needs to flow out of the first set of resistors. Hence there is no disturbance. This is the principle and may be repeated again for a third set of resistors and can be repeated for successive sets of resistors (not shown). In this circuit there is substantially no systematic error resulting from operation. Given that the currents are accurate, the error is substantially zero and independent of the resistance of the switches in the "on" or closed position used to connect the second set of segmented elements to the first set of segmented elements. This is also true for a second set connected to the third set, and other successive sets that may be connection in other circuits.

Those skilled in the art will understand that it is possible that error may occur, but any error that may be present in any practical circuit is nominal. For example, assume that the error in the second resistor string current (that provided by 214 and removed by 216) is say 1%. This error is substantial, but the true question is whether the error will cause disturbance in the system. Upon observation, it will be evident to those skilled in the art that the maximum error occurs at the maximum impedance of the center tap, which is at the halfway point. This impedance is N·R/4, where N is the number of resistors in series for each segmented resistor bank, eight in the example illustrated in FIG. 2, and R is the elemental resistance in the example of FIG. 2. The error is thus $(0.01 \cdot V/(N \cdot R)) \cdot (N \cdot R/4)$, or only 0.0025·V. Thus, the error is suppressed by a factor of 4, or two digital bits.

Examples as described pertain to audio signal processing. It will be appreciated, however, that this is illustrative of only one utility of the invention, and that the invention has greater applicability. It will be appreciated by those skilled in the art that the invention is applicable to any type of digital signal processing technology including but not limited to acoustic signal processing, image signal processing, and multi-dimensional signal processing, without departing from the spirit and scope of the invention, which is defined in the appended claims and their equivalents.

What is claimed is:

1. A segmented digital to analog converter, comprising:
   a first segment having a first plurality of resistors and configured to receive and convert one set of digital bits of a digital input signal to an analog signal;
   a second segment configured to receive and convert a second set of digital bits of the input signal to an analog signal, the second segment having a second series of resistors configured to receive the first set of digital bits, a first current source connected at one end of the second series of resistors, and a second current source connected at another end of the second series of resistors; and
   a third segment having a third segmented series of resistors including a third set of resistors connected end to end from along which an output can be generated at any point between the resistors;
   wherein the third segmented series of resistors further includes one current source connected at one end of the third sen of resistors, and a second current source connected at another end of the third series of resistors.

2. A segmented analog to digital converter of claim 1, wherein the control of at least three current sources are coordinated.

3. A segmented analog to digital converter of claim 1, wherein the control of at least three cascoded current sources connected to each of the three segments are coordinated.

4. A segmented analog to digital converter of claim 1, wherein current is delivered from each of the three current sources connected to each of the three segments in a cascoded manner.

5. A segmented analog to digital converter of claim 1, wherein each of the three segmented series of resistors is connected to one set of cascoded current sources that provide current to one end of each series of resistors, and at another end to another set of cascoded current sources to provide current to another end of each series of resistors.

6. A segmented analog to digital converter of claim 1, wherein each of the three segmented series of resistors is connected at one end to e set of cascoded current sources to source current to one end of each series of resistors, and at another end to another set of cascoded current sources to draw current from another end of each series of resistors.

7. A segmented analog to digital converter of claim 1, further comprising at least one additional set of segmented series resistors, wherein each segmented series of resistors is connected to one set of cascoded current sources that provide current to one end of each series of resistors, and at another end to another set of cascoded current sources to provide current to another end of each series of resistors.

8. A segmented digital to analog converter, comprising:
   at least three segments that each have an individual plurality of resistors and configured as a set to receive and convert one set of digital bits of a digital input signal to an analog signal;
   wherein each segment is connected to one set of cascoded current sources that provide current to one end of each series of resistors, and is connected at another end to another set of cascoded current sources to provide current to another end of each series of resistors.

9. A segmented digital to analog converter according to claim 8, wherein at least two segments each include an individual segmented series of resistor that are each connected at segmented points to a switching circuit.

10. A segmented digital to analog converter according to claim 8, wherein at least two segments each include an individual segmented series of resistors that are each connected at segmented points to a switching circuit, the converter further comprising additional successive segments of resistors connected one end to and receiving current from one set of cascoded current sources and further connected another end to and receiving current from another set of cascoded current sources.

11. A segmented digital to analog converter according to claim 8, wherein at least two segments each include an individual segmented series of resistors that are each connected at segmented points to a switching circuit, the converter further comprising additional successive segments of resistors connected one end to and receiving current from one set of cascoded current sources connected to each other via en inverted gale connection and further connected another end to and receiving current from another set of cascoded current sources.

* * * * *